United States Patent [19]

Nagasawa et al.

[11] Patent Number: 4,681,833

[45] Date of Patent: Jul. 21, 1987

[54] LIGHT-SENSITIVE NEGATIVE WORKING COMPOSITION WITH DIAZONIUM CONDENSATE, EPOXY RESIN, AND COMBINATION OF POLYMERS WITH ACRYLIC GROUPS

[75] Inventors: Kohtaro Nagasawa, Tokyo; Kunio Morikubo, Saitama, both of Japan

[73] Assignee: Somar Corporation, Tokyo, Japan

[21] Appl. No.: 709,249

[22] Filed: Mar. 7, 1985

[30] Foreign Application Priority Data

Mar. 7, 1984 [JP] Japan .................................. 59-41874

[51] Int. Cl.[4] .............................................. G03C 1/60
[52] U.S. Cl. ..................................... 430/175; 430/176;
430/905; 430/910
[58] Field of Search ................ 430/175, 176, 910, 905

[56] References Cited

U.S. PATENT DOCUMENTS

| | | | |
|---|---|---|---|
| 3,396,019 | 8/1968 | Uhlig | 430/175 |
| 3,890,152 | 6/1975 | Ruckert et al. | 430/175 |
| 4,123,276 | 10/1978 | Kita et al. | 430/286 |
| 4,275,138 | 6/1981 | Kita et al. | 430/175 |
| 4,284,707 | 8/1981 | Nagasawa et al. | 430/196 |
| 4,294,905 | 10/1981 | Okishi et al. | 430/175 |
| 4,427,760 | 1/1984 | Nagazawa et al. | 430/287 |
| 4,510,227 | 4/1985 | Mohr et al. | 430/175 |
| 4,539,285 | 9/1985 | Duyal et al. | 430/175 |

FOREIGN PATENT DOCUMENTS 2624074 12/1976 Fed. Rep. of Germany ...... 430/175

Primary Examiner—Charles L. Bowers, Jr.
Attorney, Agent, or Firm—Sughrue, Mion, Zinn, Macpeak and Seas

[57] ABSTRACT

A light-sensitive composition is described, containing: (A) a light-sensitive diazo compound, (B) a combination of Polymer (B-1) and Polymer (B-2), and (C) an epoxy resin. Polymer (B-1) is a polymer having the structural units of the general formulae (i), (ii) and (iii). Polymer (B-2) is a polymer having the structural units of the general formulae (iv), (v) and (vi).

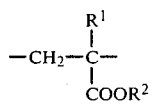

(i)

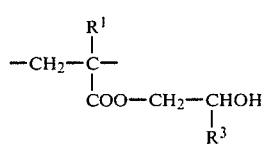

(ii)

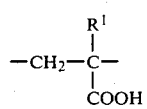

(iii)

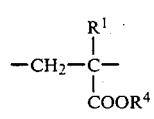

(iv)

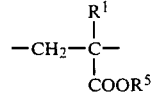

(v)

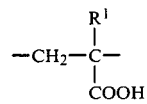

(vi)

wherein $R^1$ is a hydrogen atom or a methyl group, $R^2$ is an unsubstituted or substituted benzyl group, a lower alkyl group, or a halogen-substituted lower alkyl group, $R^3$ is a hydrogen atom, a lower alkyl group, or a halogen-substituted lower alkyl group, $R^4$ is a tert- or iso-butyl group, and $R^5$ is a lower alkyl group. This composition is a negative-type light-sensitive composition and is used to prepare a lithographic printing plate, for example. This printing plate is superior in lipophilic nature and also in mechanical properties such as abrasion resistance.

9 Claims, No Drawings

LIGHT-SENSITIVE NEGATIVE WORKING COMPOSITION WITH DIAZONIUM CONDENSATE, EPOXY RESIN, AND COMBINATION OF POLYMERS WITH ACRYLIC GROUPS

FIELD OF THE INVENTION

The present invention relates to a light-sensitive composition. More particularly, it is concerned with a light-sensitive composition containing a light-sensitive diazo compound, a polymeric compound, and an epoxy resin, which is to be used in the production of printing plates, for example.

BACKGROUND OF THE INVENTION

Light-sensitive compositions containing light-sensitive diazo compounds have heretofore been widely used. These light-sensitive compositions can be divided into two groups: (1) a positive-type light-sensitive composition that upon irradiation with light, exposed areas become soluble in a developer, and (2) a negative-type light-sensitive composition that upon irradiation with light, exposed areas are insolubilized. The present invention relates to improvements in the negative-type light-sensitive composition.

As a negative-type light-sensitive diazo compound, a condensate of 4-diazodiphenylamine and formaldehyde has long been known and widely used. This condensate, however, is water-soluble and, when used in production of lithographic printing plates, for example, has disadvantages in lipophilic nature, abrasion resistance, storage stability, and so forth. For this reason, various modifications have been made.

In lithographic printing, as is well known, water is first applied to the plate surface and then an oily ink is applied. Therefore, image areas to which the ink attaches are required to have sufficiently good lipophilic nature even in the presence of water. The conventional printing plates are inferior in this lipophilic nature, and the ink fails to attach to the image areas in a short time initially. Thus, prior to practical printing, ten or more sheets of paper, sometimes several tens of sheets of paper must be printed (trial printing) before the image areas become ready receive the ink in the presence of water. This leads to a loss of time and materials. In order to reduce the loss of time and materials, it has been desired in the art to increase the lipophilic nature of image areas.

In addition, in order to produce a large number of printed matters, it is necessary that the image areas are strong; therefore, a light-sensitive material having superior abrasion resistance has been desired.

In order to satisfy the above requirements, a procedure has been proposed in which water-soluble light-sensitive diazo compounds are reacted with aromatic acid compounds such as 4-toluenesulfonic acid to prepare the corresponding diazo salts, thereby making the diazo compounds soluble in organic solvents. The resulting salts are used singly or in combination with other polymeric compounds.

When, however, the salts are used singly, no satisfactory lipophilic nature and abrasion resistance can be obtained. For this reason, as in a wipe-on plate which is well known in the field of lithographic printing, after the formation of images, it is necessary for the image areas to be reinforced with a resin solution in order to increase their lipophilic nature and abrasion resistance.

The use of diazo compounds in combination with other resins is also known as described in Japanese Patent Application (OPI) No. 118802/75 and U.S. Pat. No. 4,299,905, for example (the term "OPI" as used herein means a "published unexamined Japanese patent application").

With the light-sensitive composition described in Japanese Patent Application (OPI) No. 118802/75, sufficiently satisfactory lipophilic nature of the amount required in the field of lithographic printing cannot be obtained, although compatibility with the diazo compounds and image-forming properties are good. Moreover, acrylonitrile or methacrylonitrile copolymers are used to reduce swelling at the time of development and to increase abrasion resistance, but the strength of the copolymers is not sufficiently high. Because of this poor strength, high printing resistance that is required in printing cannot be obtained.

In the composition of U.S. Pat. No. 4,299,905, epoxy resins are used in combination for the purpose of increasing abrasion resistance. As these epoxy resins, those resins which are liquid at ordinary temperature are used. Therefore the composition has disadvantages in that under operation conditions of high temperature and high humidity a light-sensitive layer made of the composition becomes sticky, is unstable in light-sensitivity, and can be developed only in several days. In order to prevent such sticking, it is necessary to add the diazo compound in large amounts. This, naturally, leads to a reduction in rate of sensitization.

SUMMARY OF THE INVENTION

The present invention is intended to overcome the above-described problems, and an object of the present invention is to provide a light-sensitive composition which is soluble in weak alkaline aqueous solutions and is superior in storage stability and which produces a printing plate which is good in lipophilic nature and abrasion resistance and is superior in printing resistance and storage stability.

The present invention provides a light-sensitive composition containing:
(A) a light-sensitive diazo compound;
(B) a polymeric compound; and
(C) an epoxy resin,
wherein the polymeric compound (B) is a combination of a polymer (B-1) and a polymer (B-2) as described below. Polymer (B-1): Polymer having structural units represented by the following general formulae (i), (ii) and (iii);

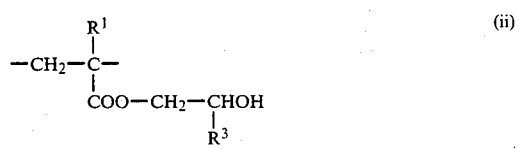

-continued

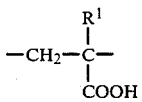
(iii)

In the above formulae, $R^1$ is a hydrogen atom or a methyl group, $R^2$ is an unsubstituted or substituted benzyl group, a lower alkyl group, or a halogen-substituted lower alkyl group, and $R^3$ is a hydrogen atom, a lower alkyl group, or a halogen-substituted lower alkyl group.

Polymer (B-2): Polymer having structural units represented by the following general formulae (iv), (v) and (vi):

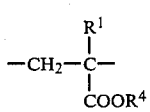
(iv)

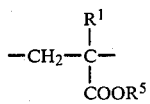
(v)

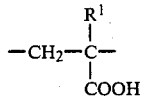
(vi)

In the above formulae (iv), (v) and (vi), $R^1$ is the same as defined above, $R^4$ is a tert- or iso-butyl group, and $R^5$ is a lower alkyl group.

DETAILED DESCRIPTION OF THE INVENTION

The components (A), (B) and (C) of the composition of the present invention will hereinafter be explained in detail.

As the component (A), any light-sensitive diazo compound can be used in the present invention without particular restriction. Examples include salts of 4-toluenesulfonic acid, 2-hydroxy-4-methoxybenzophenone-5-sulfonic acid, 2,5-dimethylbenzene sulfonic acid, naphthalene-2-sulfonic acid, 1-naphthol-2-sulfonic acid, 1-naphthol-4-sulfonic acid, etc. of a 4-diazodiphenylamine/formaldehyde condensate, a 4-diazo-3-methoxydiphenylamine/formaldehyde condensate, etc. These compounds are well known and are readily commercially available.

The polymeric compound (B) is composed of the polymers (B-1) and (B-2). It is necessary for the polymers (B-1) and (B-2) to have free carboxyl groups so that unexposed areas of the light-sensitive layer on a support are dissolved in and removed with a weak alkaline aqueous solution.

The polymer (B-1) has the structural units represented by the above general formulae (i), (ii) and (iii) at the same time. In the formulae (i), (ii) and (iii), $R^1$ is a hydrogen atom or a methyl group, and $R^2$ is an unsubstituted or substituted benzyl groups, a lower alkyl group, or a halogen-substituted lower alkyl group. The substituted benzyl group is a group resulting from substitution of a phenyl ring with the usual substituents (for example, a methyl group, an ethyl group, a methoxy group, a propyl group, a halogen atom, etc.). The lower alkyl group includes, for example, a methyl group, an ethyl group, a propyl group, and a butyl group. The halogen-substituted lower alkyl group is a lower alkyl group in which some or all of the hydrogen atoms are substituted with halogen atoms such as a chlorine atom. The lower alkyl group and halogen-substituted lower alkyl group represented by $R^3$ are the same as described above.

The polymer (B-1) can be prepared by polymerizing monomers selected from the monomers of Groups (1) to (3) as described below, i.e., a mixture of one of the monomers of Group (1), one of the monomers of Group (2), and one of the monomers of Group (3), under conditions as described hereinafter.

Group (1)

Benzyl methacrylate or acrylate, 4-methylbenzyl methacrylate or acrylate, 3-methylbenzyl methacrylate or acrylate, 4-chlorobenzyl methacrylate or acrylate, 4-methoxybenzyl methacrylate or acrylate, 4-ethylbenzyl methacrylate or acrylate, 4-iso-propylbenzyl methacrylate or acrylate, iso-butyl methacrylate or acrylate, tert-butyl methacrylate or acrylate, iso-propyl methacrylate or acrylate, methyl methacrylate or acrylate, ethyl methacrylate or acrylate, trifluoroethyl methacrylate or acrylate, and trifluoropropyl methacrylate or acrylate.

Group (2)

2-Hydroxyethyl methacrylate or acrylate, 2-hydroxypropyl methacrylate or acrylate, 2-hydroxybutyl methacrylate or acrylate, and 3-chloro-2-hydroxypropyl methacrylate or acrylate.

Group (3)

Methacrylic acid and acrylic acid.

It is necessary for the polymer (B-1) to have the structural units of the general formula (i), (ii) and (iii) at the same time. These structural units may be contained in the molecule regularly or in a block- or random-form. Moreover, they may be contained in the main chain or the side chain.

The polymer (B-1) may be prepared by polymerizing the monomers of Groups (1) to (3) and, if necessary, other copolymerizable monomers such as, for example, styrene, acrylonitrile methacrylonitrile, acrylamide, vinylbutyrate, octylvinyl ether, etc.

It is necessary, as described above, that the polymer (B-1) contains free carboxyl groups. In general, however, if the carboxyl group content is too high, swelling occurs during development, making it difficult to form sharp images, and the lipophilic nature is inferior. On the other hand, if the carboxyl group content is too low, the time needed for development is increased, and finely divided residues are formed, making it difficult to form sharp images. The polymer (B-1) has a suitable free carboxyl group content when the molar ratios of the monomers of Groups (1) to (3) are specified as follows:

$(m_1+m_2)/m_3$ = about 1.5 to 9 (preferably about 2 to 6)

wherein $m_1$, $m_2$ and $m_3$ represent mole contents of Groups (1), (2) and (3) in the polymer (B-1), respectively.

The carboxyl group content is determined on the basis of an acid value. Usually the acid value is from about 10 to 80, with the range of from about 20 to 50 being preferred. The above formula: $(m_1+m_2)/m_3$=about 1.5 to 9 corresponds to a formula representing a ratio of the structural units of the general formulae (i) to (iii), i.e., {(i)+(ii)}/(iii)=about 1.5 to 9.

The molecular weight of the polmer (B-1) is usually from about 5,000 to 100,000 and preferably from about 20,000 to 80,000. If the molecular weight is less than 5,000, the mechanical strength of images is inferior, and printing resistance is poor. On the other hand, if it is in excess of 100,000, developing properties are inferior, and, moreover, residues are formed during development and no sharp images can be obtained.

The polymer (B-1) has good compatibility with the light-sensitive diazo compound (A). With a combination of the polymer (B-1) and the light-sensitive diazo compound (A) alone, image formation can be attained. In this case, the resulting composition can produce only a light-sensitive layer which is inferior in abrasion resistance and is not sufficiently high in lipophilic nature. In accordance with the present invention, therefore, to improve the lipophilic nature and the adhesiveness to a support, thereby increasing the abrasion resistance, the polymer (B-2) must also be included.

The polymer (B-2) has the structural units of the general formulae (iv), (v) and (vi) at the same time. In the general formulae (iv), (v) and (vi), $R^1$ is the same as described above, and $R^4$ is a tert- or iso-butyl group and $R^5$ is a lower alkyl group, such as, for example, a methyl group, an ethyl group, a propyl group, and a butyl group.

The polymer (B-2) can be prepared by polymerizing monomers selected from the monomers of Groups (4) to (6) as described hereinafter, i.e., a mixture of one of the monomers of Group (4), one of the monomers of Group (5), and one of the monomers of Group (6), under conditions as described hereinafter.

Group (4)

Tert-butyl methacrylate, iso-butyl methacrylate, tert-butyl acrylate, and iso-butyl acrylate.

Group (5)

Methyl methacrylate or acrylate, ethyl methacrylate or acrylate, n-propyl methacrylate or acrylate, iso-propyl methacrylate or acrylate.

Group (6)

Methacrylic acid and acrylic acid.

The arrangement of the structural units in the polymer (B-2) can be the same as described for the polymer (B-1). In the preparation of the polymer (B-2), as in the polymer (B-1), if necessary, other copolymerizable monomers such as, for example, styrene, acrylonitrile, methacrylonitrile, acrylamide, vinylbutyrate, octylvinyl ether, etc. may be copolymerized therewith.

In the polymer (B-2), the molar ratio of the monomers of Groups (4) to (6) is preferably specified as follows:

$(n_1+n_2)/n_3$=about 1 to 20 (particularly about 3 to 10)

wherein $n_1$, $n_2$ and $n_3$ represent mole contents of Groups (4), (5) and (6) in the polymer (B-2), respectively.

If the molar ratio of less than 1, swelling due to an alkaline aqueous solution occurs at the time of development. On the other hand, if it is in excess of 20, development is difficult, and residues are formed and sharp images can not be obtained. The above formula: $(n_1+n_2)/n_3$=about 1 to 20 corresponds to a formula representing a ratio of the structural units of the general formulae (iv) to (vi), i.e., {(iv)+(v)}/(vi)=about 1 to 20.

The molecular weight of the polymer (B-2) is usually from about 50,000 to 500,000 and preferably from about 100,000 to 300,000. If the molecular weight is less than 50,000, the mechanical strength of images is inferior, and also the abrasion resistance is poor. On the other hand, if it is in excess of 500,000, development becomes impossible.

The polymer (B-2) is superior in lipophilic nature but its compatibility with the light-sensitive diazo compound is not so good. Thus it is necessary for the polymer (B-2) to be used in combination with the polymer (B-1).

As the component (C), various epoxy resins can be used. Particularly preferred are epoxy resins which have an epoxy equivalent of from about 150 to 2,000, preferably from about 200 to 1,500 and which are solid at ordinary temperature (e.g., 20° C.). Examples are those epoxy resins belonging to Epikote 1000 series (produced by Yuka Shell Epoxy Co., Ltd.), YDCN 220 series (produced by Tohto Kasei Co., Ltd.), and EOCN 100 series (produced by Nippon Kayaku Co., Ltd.), which are commercially available and are of the bisphenol A type, novolak type, and so forth. The epoxy equivalent means a number of grams of a resin containing a 1 gram equivalent of an epoxy group. If the epoxy equivalent is less than 150, a light-sensitive composition containing such an epoxy resin is unstable in light-sensitivity and the ultimate light-sensitive layer is sticky. On the other hand, if it is in excess of 2,000, development becomes difficult and no sharp images can be obtained.

Incorporation of each epoxy resins results in a marked increase in abrasion resistance and is advantageous particularly for uses in which post-baking (heating treatment after image formation) is performed.

The proportions of the light-sensitive diazo compound (A), the polymeric compound (B), and the epoxy resin (C) in the light-sensitive composition of the present invention can be determined appropriately depending on the purpose for which the light-sensitive composition is used. If the diazo compound content is too large, a rate of sensitization to light drops and further lipophilic nature and abrasion resistance drop. Thus the proportion of the light-sensitive diazo compound (A) in the light-sensitive composition is usually from about 1 to 40% by weight and preferably from about 5 to 35% by weight. The proportion of the polymer (B-1) in the light-sensitive composition is usually from about 30 to 75% by weight and preferably from about 35 to 70% by weight so that image formation can be carried out efficiently because of its good compatibility with the diazo compound. The proportion of the polymer (B-2) in the light-sensitive composition is usually from 0.1 to 20% by weight and preferably from about 1 to 15% by weight so that the lipophilic nature is increased efficiently. The proportion of the epoxy resin (C) in the light-sensitive composition is usually from about 5 to 50% by weight and preferably from about 10 to 40% by weight so that abrasion resistance and printing resistance are increased efficiently. If the epoxy resin content is increased, mechanical strength such as abrasion resistance is increased. However, developing properties are reduced. Thus, for uses in which particularly high resolution is needed, it is desirable to decrease the epoxy resin content.

The light-sensitive composition of the present invention may contain other additives as well as the light-sensitive diazo compound (A), the polymeric compound (B), and the epoxy resin (C). For example, dyes and pigments may be added for the purpose of making images more visible, and surface active agents, for example, may be added for the purpose of increasing coating performance.

The light-sensitive composition of the present invention is coated on a support in the form of a solution by the use of, e.g., a roll coater, a bar coater, and a rotary coating machine. Organic solvents which can be used for this purpose include ethylene glycol monomethyl ether (which is especially suitable for use in dissolving the light-sensitive diazo compound), ethylene glycol monoethyl ether, ethylene glycol monomethyl ether acetate, methyl ethyl ketone, dimethylformamide, and tetrahydrofuran. These organic solvents can be used singly or in combination with each other.

The present invention is described in greater detail with reference to the following non-limiting examples. All parts are by weight.

EXAMPLE 1

(1) Preparation of Polymer (B-1): Copolymer of Benzyl Methacrylate, 2-Hydroxyethyl Methacrylate, and Acrylic Acid A reactor equipped with a nitrogen-introduction tube and a stirrer was charged with 500 g of methyl ethyl ketone, 170 g of benzyl methacrylate, 60 g of 2hydroxyethyl methacrylate, 12 g of acrylic acid, and 0.7 g of benzoyl peroxide in an atmosphere of nitrogen. They were then reacted at a temperature of from 70° to 75° C. for 10 hours to yield a viscous solution. This viscous solution was poured into 20 l of water while vigorously stirring, whereupon a white precipitate was formed. This white precipitate was removed by filtration, washed with water, and then dried to yield 200 g of the desired copolymer having an acid value of 25 and an intrinsic viscosity: $[\eta]_{MC}^{25°\ C.} = 0.135$ (MC=ethylene glycol monomethyl ether).

(2) Preparation of Polymer (B-2): Copolymer of Tert-Butyl Methacrylate, Methyl Methacrylate, and Methacrylic Acid A mixture of 535 g of water, 80 g of tert-butyl methacrylate, 15 g of methyl methacrylate, 13 g of methacrylic acid, 1 g of benzoyl peroxide, and 2.4 g of polyethylene oxide (Polyox WSR N-80 produced by Union Carbide Corporation, U.S.A.; molecular weight: 200,000) was placed in the same reactor as above in an atmosphere of nitrogen and reacted for 6 hours at 75° to 80° C. at a stirring rate of 700 to 800 rpm. After the reaction was completed, the reaction product was removed by filtration, washed with water, and dried to yield 95 g of the desired bead-shaped copolymer. The acid value of the copolymer was 45, and $[\eta]_{MC}^{25°\ C.}$ was 0.358.

(3) Preparation of Light-Sensitive Composition

|   |   | Amount (parts) |
|---|---|---|
| (A) | 4-Toluenesulfonic acid salt of 4-diazodiphenylamine/formaldehyde condensate | 10 |
| (B-1) | Benzyl methacrylate/2-hydroxyethyl methacrylate/acrylic acid copolymer | 60 |
| (B-2) | Tert-butyl methacrylate/methyl methacrylate/methacrylic acid copolymer | 5 |
| (C) | Epikote 1003 (produced by Yuka Shell Epoxy Co., Ltd.; epoxy equivalent: 700) | 25 |
| (Dye) | Rhodamine B (C.I. Basic Violet 10) | 2 |

The above compounds were mixed to prepared a light-sensitive composiion. This composition was dissolved in 300 parts of ethylene glycol monomethyl ether to prepare a light-sensitive solution having a viscosity of 140 cps (25° C.).

(4) Application

The above-prepared light-sensitive solution was coated on a 0.3 mm thick aluminum plate which had been abraded with a brush and then subjected to an anodizing treatment, by the use of a roll coater, and then dried by blowing hot air maintained at 90° C. for 3 minutes to produce a presensitized (PS) plate having 1.5 g/m$^2$ (calculated as solids) of a light-sensitive layer. A negative original was placed on the PS plate, which was then irradiated with ultraviolet light for 40 seconds by the use of a 2 kw super high-pressure mercury lamp placed at a distance of 1 m (light intensity: 1.5 mW/cm$^2$). After irradiation, the PS plate was developed with a developer composed of 20 g of benzyl alcohol, 2 g of sodium silicate, Tohol N230 (surface active agents, produced by Toho Kagaku Kogyo Co., Ltd.), and 76 g of water. Upon development, a printing plate with a sharp pattern was produced.

The printing plate was run on an offset rotary printing machine to produce 150,000 copies. Even after reproduction of 150,000 copies, the printing plate was not damaged and further printing was possible.

The printing plate was superior in attachment of an ink to image area and thus good copies were obtained by rotating the machine only several times. The printing plate was subjected to post baking for 10 minutes in an oven maintained at 200° to 220° C. and then run on an offset rotary printing machine to produce 500,000 copies. In this printing plate, partial damage of the aluminum support was observed but the image areas were not damaged at all. Thus it was confirmed that the printing plate had high abrasion resistance.

The above-produced PS plate was stored at room temperature for 6 months. Then the developing and printing properties and so forth of the PS plate were examined in the same manner as above with the same results. Thus it was confirmed that the PS plate had sufficiently high storage stability.

EXAMPLE 2

(1) Preparation of Polymer (B-1): Copolymer of Tert-Butyl Methacrylate, 2-Hydroxyethyl Methacrylate, and Methacrylic Acid A reactor equipped with a nitrogen-introduction tube and a stirrer was charged with 500 g of methyl ethyl ketone, 150 g of tert-butyl methacrylate, 70 g of 2-hydroxyethyl methacrylate, 15 g of methacrylic acid, and 0.7 g of benzoyl peroxide. They were then reacted at 70° to 75° C. for 9 to 10 hours while stirring in a stream of nitrogen. The resulting viscous solution was poured into 20 l of water. The precipitate thus obtained was removed by filtration and then dried to yield 210 g of the desired copolymer having an acid value of 32 and $[\eta]_{MC}^{25°}$ C.=0.165.

(2) Preparation of Polymer (B-2): Copolymer of Iso-Butyl Methacrylate, Methyl Methacrylate, and Acrylic Acid A mixture of 535 g of water, 80 g of iso-butyl methacrylate, 20 g of methyl methacrylate, 13 g of acrylic acid, 1 g of benzoyl peroxide, and 2.4 g of polyethylene oxide (same as used above) was placed in the same reactor as used above, and they were reacted in an atmosphere of nitrogen for 6 hours at 75° to 80° C. at a stirring rate of 700 to 800 rpm. After the reaction was completed, the precipitate was removed by filtration, washed with water, and then dried to yield 90 g of the desired bead-shaped copolymer. The acid value of the copolymer was 45, and $[\eta]_{MC}^{25°}$ C.=0.305

(3) Preparation of Light-Sensitive Composition

|       |                                                                           | Amount (parts) |
|-------|---------------------------------------------------------------------------|----------------|
| (A)   | 4-Toluenesulfonic acid salt of 4-diazodiphenylamine/formaldehyde condensate | 10             |
| (B-1) | Tert-butyl methacrylate/2-hydroxyethyl methacrylate/methacrylic acid copolymer | 50             |
| (B-2) | Iso-butyl methacrylate/methyl methacrylate/acrylic acid copolymer          | 10             |
| (C)   | Epikote 1003 (same as used above)                                          | 30             |
| (Dye) | Rhodamine B (same as used above)                                           | 2              |

The above compounds were mixed to prepare a light-sensitive composition. This composition was dissolved in 400 parts of ethylene glycol monomethyl ether to prepare a light-sensitive solution having a viscosity of 80 cps (25° C).

(4) Application

The above-prepared light-sensitive solution was coated on an aluminum plate (thickness: 0.3 mm) which had been abraded with a brush and then subjected to an anodizing treatment, by the use of a roll coater and then dried by blowing hot air maintained at 80° to 90° C. for 3 minutes to produce a PS plate having 1.8 g/m² (calculated as solids) of a light-sensitive layer. A negative original was placed on the PS plate, which was then irradiated with ultraviolet light for 70 seconds by the use of a 2 kw super high-pressure mercury lamp placed at a distance of 1 m (light intensity: 1.5 mW/cm²). After irradiation, the PS plate was developed with a developer composed of 20 g of benzyl alcohol, 1.5 g of sodium carbonate, 1.5 g of Tohol N230 (same as used above), and 77 g of water. Upon development, a printing plate having a sharp pattern was produced.

The above-produced PS plate exhibited good developing properties even when stored at 40° C. for 20 days. This demonstrates that when the PS plate is stored at room temperature, it exhibits good storage stability for more than 2 years.

For comparison, a light-sensitive composition was prepared in the same manner as in Example 2 except that the Polymer (B-1)/Polymer (B-2) mixture was replaced by 60 parts of a 2-hydroxyethyl methacrylate/acrylonitrile/methyl methacrylate/methacrylic acid copolymer as prepared in the same manner as in the preparation of the Polymers (B-1) and (B-2). This light-sensitive composition was used to produce a printing plate in the same manner as in Example 2. This printing plate was placed on a two-color printing machine (produced by Heiderberg Co., West Germany) and tested for printing properties.

The test results are shown in Table 1 along with those of the printing plate of Example 2.

TABLE 1

| Run No. | Ink-Receiving Property (Lipophilic Nature) | | Printing Resistance | |
|---------|-------|---|-------|---|
| Printing Plate of Example 2 | Number of Wasted Paper | 8 | Number of Copies | 200,000 |
| Comparative Printing Plate | Number of Wasted Paper | 30 | Number of Copies | 100,000 |

The number of wasted paper means the number of sheets of printing paper wasted until a normal printed matter or copy is obtained. As the number of wasted paper is decreased, the uniform attachment of the ink to the whole surface of the printing plate is better. Thus it can be seen that the printing plate of the present invention has good ink-receiving property (lipophilic nature). The printing resistance is determined by counting how many copies can be obtained before normal printing can no longer be performed. As the number of copies is increased, the printing resistance is better.

It can be seen from the results of Table 1 that the printing plate of the present invention is superior in ink-receiving property (lipophilic nature) and printing resistance to the comparative printing plate.

EXAMPLE 3

(1) Preparation of Light-Sensitive Composition

|       |                                                                          | Amount (parts) |
|-------|--------------------------------------------------------------------------|----------------|
| (A)   | The same diazo compound as used in Example 1                             | 18             |
| (B-1) | The same copolymer (B-1) as used in Example 1                            | 45             |
| (B-2) | The same copolymer (B-2) as used in Example 2                            | 5              |
| (C)   | EOCN 103 (produced by Nippon Kayaku Co., Ltd; epoxy equivalent: 215)     | 30             |
| (Dye) | Aizen Victoria Blue BH (C.I. Basic Blue 26, produced by Hodogaya Chemical Co., Ltd.) | 2 |
|       | (Surface active agent) Polyoxyethylene sorbitan monolaurate              | 0.1            |

The above compounds were mixed to prepare a light-sensitve composition. This composition was dissolved in a mixed solvent of 250 parts of ethylene glycol monomethyl ether and 50 parts of ethylene glycol monoethyl ether to prepare a light-sensitive solution having a viscosity of 130 cps (25° C.).

(2) Application

Copper was electrically deposited in a thickness of about 3 μm on both surfaces of a 0.3 mm thick iron plate, one of which was further plated with chromium in a thickness of about 2 μm. This chromium layer was grained. The above-prepared light-sensitive solution was coated on the grained chromium layer of the support by the use of a roll coater and then dried to prepare 1.5 g/m² (calculated as solids) of a light-sensitive layer. A negative original was brought into close contact with the above-produced light-sensitive plate, which was irradiated with ultraviolet light for 40 seconds by the use of a 3 kw super high-pressure mercury lamp at a distance of 1 m (light intensity: 3.5 mW/cm²) and then developed with the same developer as used in Example 2 to produce a printing plate. The printing plate was heated at 200° C. for 10 minutes and, thereafter, it was mounted on an offset rotary printing machine and was used to print 500,000 copies. This printed matter was good and the printing plate could be used for further printing.

A positive original was brought into close contact with the light-sensitive layer of the above light-sensitive material and, thereafter, it was baked and developed in the same manner as above to produce a reverse image pattern. The chromium layer was etched with a solution composed of 80 g of zinc chloride, 100 ml of a 40% by weight calcium chloride solution, and 3 ml of phosphoric acid. The light-sensitive layer exhibited sufficiently satisfactory resistance, and the light-sensitive layer was removed with a 5% by weight aqueous solution of sodium hydroxide to produce a good printing plate.

EXAMPLES 4 TO 7

Four light-sensitive compositions were prepared by mixing compounds as shown in Table 2.

Each composition was dissolved in 900 parts of ethylene glycol monomethyl ether to prepare a light-sensitive solution.

TABLE 2

| Compounds | Example No. | | | |
|---|---|---|---|---|
| | 4 | 5 | 6 | 7 |
| Diazo compound* (parts) | 20 | 10 | 15 | 30 |
| Copolymer (B-1) of Example 1 (parts) | 40 | 55 | 65 | 45 |
| Copolymer (B-2) of Example 1 (parts) | 10 | 3 | 5 | 3 |
| Epikote 1001 (produced by Yuka Shell CO., Ltd.; epoxy equivalent: 450 to 500) (parts) | 28 | 30 | 15 | 20 |
| i en Victoria Blue BH (same as described above) (parts) | 2 | 2 | 2 | 2 |

Note: *2-Hydroxy-4-methoxybenzophenone-5-sulfonic acid salt of a 4-diazodiphenylamine/formaldehyde condensate The light-sensitive solution was coated on an aluminum support (thickness: 0.3 mm) which had been abraded with a brush and then subjected to an anodizing treatment, by the use of a rotary coating machine, and then dried to produce a PS plate for printing, having 1.5 g/m² (calculated as solids) of light-sensitive layer. This PS plate was exposed to light and developed in the same manner as in Example 1 to produce a printing plate. This printing plate was measured for performance, and the results are shown in Table 4.

For comparison, light-sensitive compositions composed of compounds as shown in Table 3, i.e., compositions in which at least one of any of Polymers (B-1) and (B-2), and Component (C) was omitted, were prepared in the same manner as above.

TABLE 3

| Compounds | Comparative Example No. | | | |
|---|---|---|---|---|
| | 1 | 2 | 3 | 4 |
| Diazo compound used in Examples 4 to 7 (Table 2) (parts) | 30 | 20 | 20 | 28 |
| Copolymer (B-1) of Example 1 (parts) | 50 | 52 | — | 70 |
| Copolymer (B-2) of Example 1 (parts) | — | 10 | 58 | — |

TABLE 3-continued

| Compounds | Comparative Example No. | | | |
|---|---|---|---|---|
| | 1 | 2 | 3 | 4 |
| Epikote 1001 (same as used above) (parts) | 18 | — | 20 | — |
| Aizen Victoria Blue BH (same as used above) (parts) | 2 | 2 | 2 | 2 |

Light-sensitive solutions were prepared using the light-sensitive compositions of Comparative Examples 1 to 4 which were prepared in the same manner as above. Using these light-sensitive solutions, printing plates were produced also in the same manner as above. These printing plates were tested for performance, and the results are shown in Table 4.

It can be seen from the results of Tables 1 and 4 that the light-sensitive compositions of the present invention are superior in light-sensitivity, developing property, ink-receiving property (lipophilic nature), and printing resistance to the comparative light-sensitive compositions; that is, the objects of the present invention are attained by using the present light-sensitive compositions.

TABLE 4

| | Performance | | | |
|---|---|---|---|---|
| Run No. | Light-Sensitivity | Developing Property | Ink-Receiving Property (Lipophilic Nature) | Printing Resistance |
| Example | | | | |
| 4 | Good | Excellent | Excellent | Excellent |
| 5 | Excellent | Good | Good | Excellent |
| 6 | Excellent | Excellent | Excellent | Good |
| 7 | Good | Excellent | Good | Good |
| Comparative Example | | | | |
| 1 | Good | Excellent | Bad | Bad |
| 2 | Good | Good | Excellent | Bad |
| 3 | Bad | Good | Excellent | Bad |
| 4 | Excellent | Excellent | Bad | Bad |

In Table 4, the light-sensitivity, developing property, ink-receiving property (lipophilic nature), and printing resistance were determined as follows.

Light-Sensitivity

A plate sample is exposed to a super high-pressure mercury lamp (3 kw) placed at a distance of 1 m (light intensity: 3.5 mW/cm²). The time required for printing until all 6 steps of a √2 step tablet (Kodak Step Table No. 2) are exposed, and the strength of a light-cured film are measured. The rating scale is as follows.

| Necessary Exposure Time | Evaluation |
|---|---|
| 20 to 30 seconds | Excellent |
| 40 to 90 seconds | Good |
| Only a weak light-cured film is obtained even if exposure is performed for more than 120 seconds | Bad |

Developing Property

The time required for development using the same developer as used in Example 1 is measured. The rating scale is as follows.

| Necessary Developing Time | Evaluation |
|---|---|
| 60 seconds or less | Excellent |
| More than 60 to 90 seconds | Good |
| More than 90 seconds | Bad |

Ink-Receiving Property (Lipophilic Nature)

The number of sheets of wasted paper after the start of printing (papers for trial printing) is determined. The rating scale is as follows.

| Number of Wasted Paper | Evaluation |
|---|---|
| 9 or less | Excellent |
| 10 to 20 | Good |
| More than 20 | Bad |

Printing Resistance

An abrasion testing machine is used in this test. The number of copies produced normally before the image areas of the plate are worn out and the ink does not normally attach thereto is determined. The rating scale is as follows.

| Number of Copies | Evaluation |
|---|---|
| More than 200,000 | Excellent |
| 200,000 to 100,000 | Good |
| Less than 100,000 | Bad |

While the invention has been described in detail and with reference to specific embodiments thereof, it will be apparent to one skilled in the art that various changes and modifications can be made therein without departing from the spirit and scope thereof.

What is claimed is:

1. A negative-working light-sensitive composition consisting essentially of in admixture:
   (A) a light-sensitive diazo compound which is a salt of a 4-diazodiphenylamine/formaldehyde condensate;
   (B) a polymeric compound; and
   (C) an epoxy resin, wherein the polymeric compound (B) is a combination of Polymer (B-1) and Polymer (B-2) as described below:

Polymer (B-1):
Polymer containing the structural units of the following general formulae (i), (ii) and (iii):

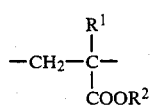

(i)

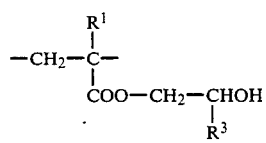

(ii)

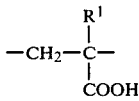

(iii)

(wherein $R^1$ is a hydrogen atom or a methyl group, $R^2$ is an unsubstituted or substituted benzyl group, a lower alkyl group). or a halogen-substituted lower alkyl group, and $R^3$ is a hydrogen atom, a lower alkyl group, or a halogen-substituted lower alkyl group:

Polymer (B-2):
Polymer containing the structural units of the following general formulae (iv), (v) and (vi):

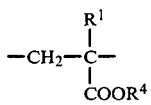

(iv)

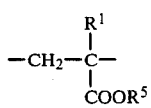

(v)

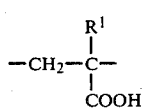

(vi)

(wherein $R^1$ is the same as defined above, $R^4$ is a tert- or iso-butyl group, and $R^5$ is a lower alkyl group),
and wherein the proportion of component (A) is from about 1 to 40% by weight, the proportion of the polymer (B-1) is from about 30 to 75% by weight, the proportion of the polymer (B-2) is from about 0.1 to 20% by weight, and the proportion of the epoxy resin (C) is from about 5 to 50% by weight.

2. The composition as claimed in claim 1, wherein the light-sensitive diazo compound (A) is a 2-hydroxy-4-methoxybenzophenone-5-sulfonic acid salt of a 4-diazodiphenylamine/formaldehyde condensate.

3. The composition as claimed in claim 1, wherein in the general formulae (i) to (iii), $R^2$ is an unsubstituted benzyl group.

4. The composition as claimed in claim 1, wherein in the general formulae (iv) to (vi), $R^4$ is a tert-butyl group.

5. The composition as claimed in claim 1, wherein in the polymer (B-1), the ratio of the structural units of the general formulae (i), (ii) and (iii) is such that {(i)+(ii)}/(iii) is from about 1.5 to 9, and the molecular weight of the polymer (B-1) is from about 5,000 to 100,000.

6. The composition as claimed in claim 1, wherein in the polymer (B-2), the ratio of the structural units of the general formulae (iv), (v) and (vi) is such that {(iv)+(v)}/(vi) is from about 1 to 20, and the molecular weight of the polymer is from about 50,000 to 500,000.

7. The composition as claimed in claim 1, wherein the epoxy resin (C) has an epoxy equivalent of from about 150 to 2,000 and is solid at 20° C.

8. The composition as claimed in claim 1, wherein the epoxy resin (C) is a glycidyl ether of bisphenol A which has an epoxy equivalent of from about 150 to 2,000 and is solid at 20° C.

9. The composition as claimed in claim 1, wherein the epoxy resin (C) is a glycidyl ether of phenol or cresol novolak which has an epoxy equivalent of from about 150 to 2,000 and is solid at 20° C.

* * * * *